United States Patent
Singh et al.

(10) Patent No.: US 9,117,822 B1
(45) Date of Patent: Aug. 25, 2015

(54) METHODS AND STRUCTURES FOR BACK END OF LINE INTEGRATION

(71) Applicant: GLOBALFOUNDRIES Inc., Grand Cayman (KY)

(72) Inventors: Sunil K. Singh, Mechanicville, NY (US); Ravi P. Srivastava, Clifton Park, NY (US); Mark A. Zaleski, Galway, NY (US); Akshey Sehgal, Malta, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/264,163

(22) Filed: Apr. 29, 2014

(51) Int. Cl.
*H01L 29/66* (2006.01)
*H01L 21/4763* (2006.01)
*H01L 21/31* (2006.01)
*H01L 23/532* (2006.01)
*H01L 23/528* (2006.01)
*H01L 23/522* (2006.01)
*H01L 21/768* (2006.01)
*H01L 21/02* (2006.01)
*H01L 21/311* (2006.01)
*H01L 21/3105* (2006.01)
*H01L 21/3213* (2006.01)

(52) U.S. Cl.
CPC .... *H01L 23/53238* (2013.01); *H01L 21/02118* (2013.01); *H01L 21/02126* (2013.01); *H01L 21/31051* (2013.01); *H01L 21/31138* (2013.01); *H01L 21/32133* (2013.01); *H01L 21/76802* (2013.01); *H01L 21/76843* (2013.01); *H01L 21/76879* (2013.01); *H01L 23/528* (2013.01); *H01L 23/5226* (2013.01)

(58) Field of Classification Search
CPC ............ H01L 21/3081; H01L 21/2071; H01L 21/31188; H01L 21/4763
USPC .......... 257/139, 758, 331, 760; 438/631, 703, 438/622, 619
See application file for complete search history.

(56) References Cited

U.S. PATENT DOCUMENTS

| | | | |
|---|---|---|---|
| 6,903,002 B1 | 6/2005 | Ben-Tzur et al. | |
| 2002/0127844 A1* | 9/2002 | Grill et al. | 438/622 |
| 2005/0074961 A1* | 4/2005 | Beyer et al. | 438/619 |
| 2008/0171431 A1* | 7/2008 | Yu et al. | 438/618 |
| 2010/0102452 A1* | 4/2010 | Nakao | 257/773 |
| 2013/0244439 A1 | 9/2013 | Ghariehali et al. | |
| 2013/0341793 A1* | 12/2013 | Suzumura et al. | 257/751 |

\* cited by examiner

*Primary Examiner* — Long K Tran
*Assistant Examiner* — Dzung Tran
(74) *Attorney, Agent, or Firm* — Williams Morgan, P.C.

(57) ABSTRACT

Embodiments of the present invention provide a semiconductor structure for BEOL (back end of line) integration. A directed self assembly (DSA) material is deposited and annealed to form two distinct phase regions. One of the phase regions is selectively removed, and the remaining phase region serves as a mask for forming cavities in an underlying layer of metal and/or dielectric. The process is then repeated to form complex structures with patterns of metal separated by dielectric regions.

10 Claims, 19 Drawing Sheets

METHODS AND STRUCTURES FOR BACK END OF LINE INTEGRATION

FIELD OF THE INVENTION

The present invention relates generally to semiconductor fabrication, and more particularly, to methods and structures for back end of line integration.

BACKGROUND

As technology progresses, the manufacture of electronic devices must be improved to meet the trend of mobile, lightweight, and efficient electronic devices. However, as devices scale, certain processes become quite challenging. These challenges include narrow pattern transfer, filling of metal lines, and copper recess control. These issues can cause problems such as RC delay and TDDB (time dependent dielectric breakdown) that can adversely affect device performance. It is therefore desirable to have improvements in back end of line integration to address the aforementioned challenges.

SUMMARY

Embodiments of the present invention provide a semiconductor structure for BEOL (back end of line) integration. A directed self assembly (DSA) material is deposited and annealed to form two distinct phase regions. One of the phase regions is selectively removed, and the remaining phase region serves as a mask for forming cavities in an underlying layer of metal and/or dielectric. The process is then repeated to form complex structures with patterns of metal separated by dielectric regions.

In a first aspect, embodiments of the present invention provide a method of forming a semiconductor structure, comprising: depositing a first dielectric layer on a semiconductor substrate; depositing a first layer of DSA material on the first dielectric layer; performing a phase separation of the first layer of DSA material into a first phase region and a second phase region; selectively etching one phase region of the first phase region and second phase region of the first layer of DSA material; forming cavities in the first dielectric layer; depositing a metal fill layer in the cavities of the first dielectric layer; depositing a second layer of DSA material over the metal fill layer; performing a phase separation of the second layer of DSA material into a first phase region and a second phase region; selectively etching one phase region of the first phase region and second phase region of the second layer of DSA material; forming cavities in the metal fill layer; and depositing a second dielectric layer over the metal fill layer and in the metal layer cavities.

In a second aspect, embodiments of the present invention provide a method of forming a semiconductor structure, comprising: depositing a first etch stop layer on a semiconductor substrate; depositing a first layer of DSA material on the etch stop layer; performing a phase separation of the first layer of DSA material into a first phase region and a second phase region; selectively etching one phase region of the first phase region and second phase region of the first layer of DSA material; removing a portion of the first etch stop layer; depositing a first metal layer on the semiconductor substrate; depositing a second etch stop layer on the first metal layer; depositing a second layer of DSA material on the second etch stop layer; performing a phase separation of the second layer of DSA material into a first phase and a second phase; selectively etching one phase region of the first phase region and second phase region of the second layer of DSA material; performing an etch to remove a portion of the first metal layer; depositing a dielectric layer over the first metal layer; forming a plurality of cavities in the dielectric layer to expose a portion of the first metal layer; and depositing a second metal layer in the plurality of cavities.

In a third aspect, embodiments of the present invention provide a semiconductor structure comprising: a semiconductor substrate; a first layer of dielectric disposed on the semiconductor substrate; a metal region formed on the first layer of dielectric, wherein a portion of the metal region traverses the first layer of dielectric and is in contact with the semiconductor substrate; a plurality of insulator regions disposed in the metal region, wherein the plurality of insulator regions are comprised of a low-K dielectric.

BRIEF DESCRIPTION OF THE DRAWINGS

The accompanying drawings, which are incorporated in and constitute a part of this specification, illustrate several embodiments of the present teachings and, together with the description, serve to explain the principles of the present teachings.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1A:
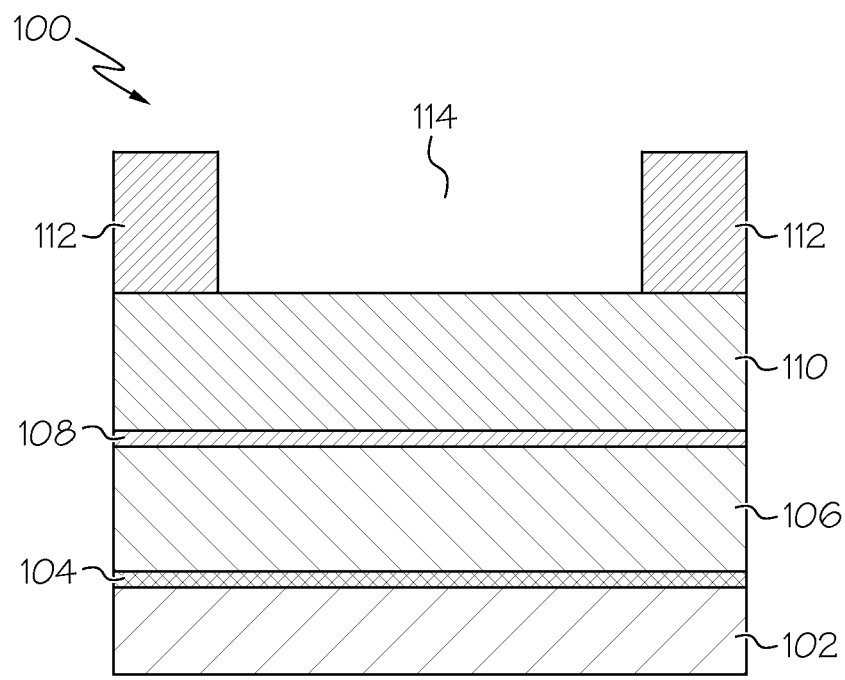

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

FIG. 1A is a semiconductor structure at a starting point for illustrative embodiments.

Figure 1B:
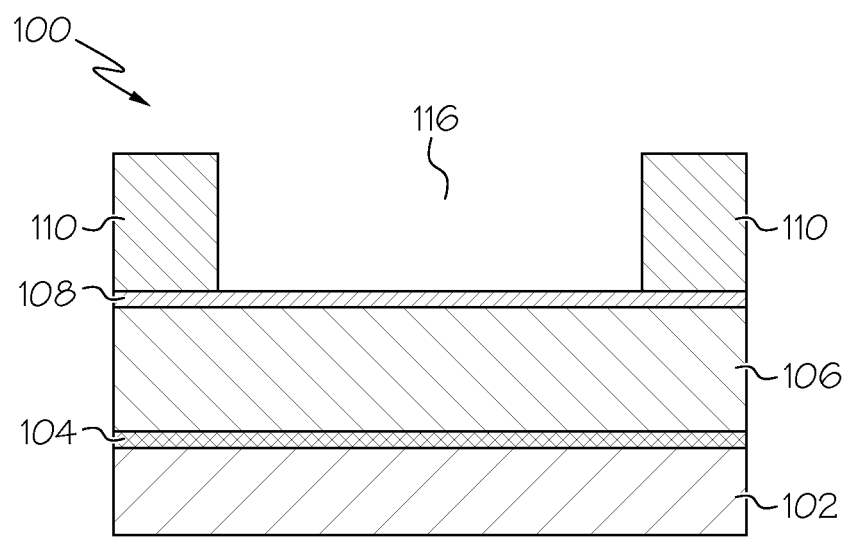

FIG. 1B is a semiconductor structure after a subsequent process step of etching a sacrificial layer in accordance with illustrative embodiments.

Figure 1C:
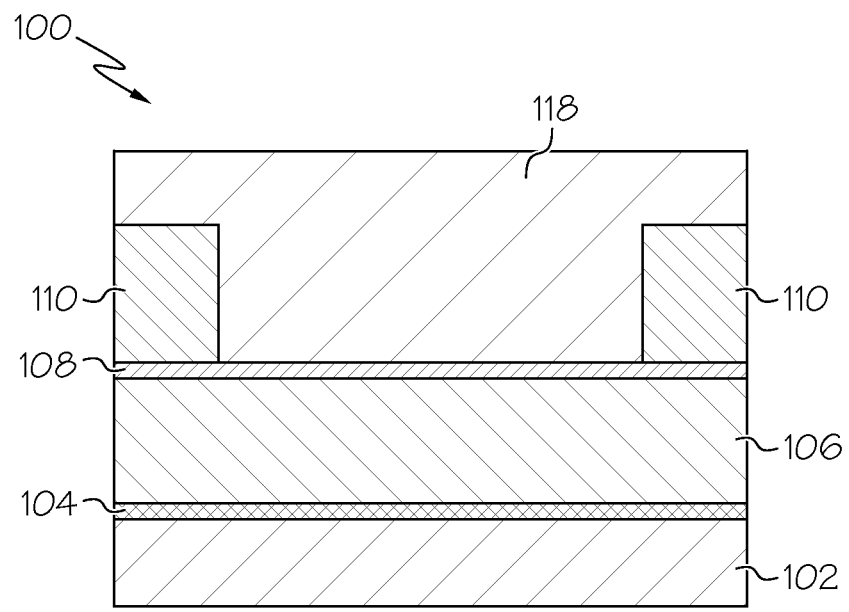

FIG. 1C is a semiconductor structure after a subsequent process step of depositing a first DSA material layer in accordance with illustrative embodiments.

Figure 1D:
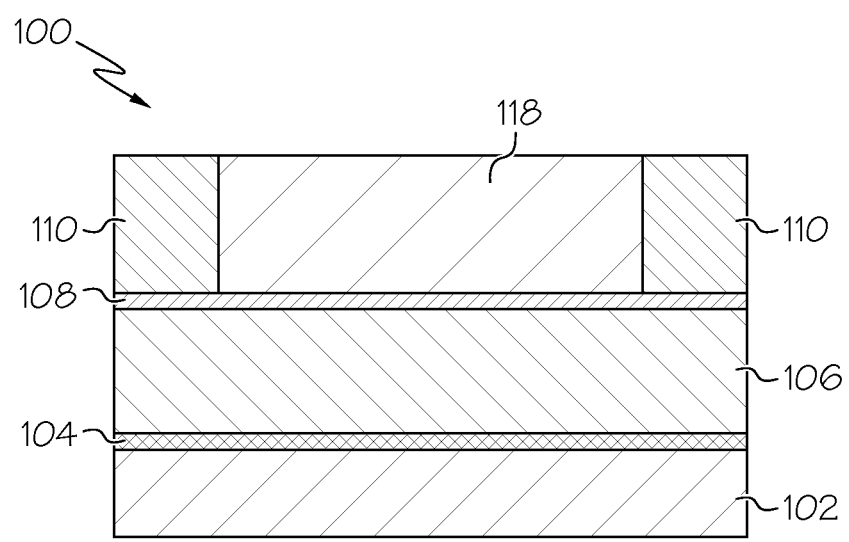

FIG. 1D is a semiconductor structure after a subsequent process step of recessing the first DSA material layer in accordance with illustrative embodiments.

Figure 1E:
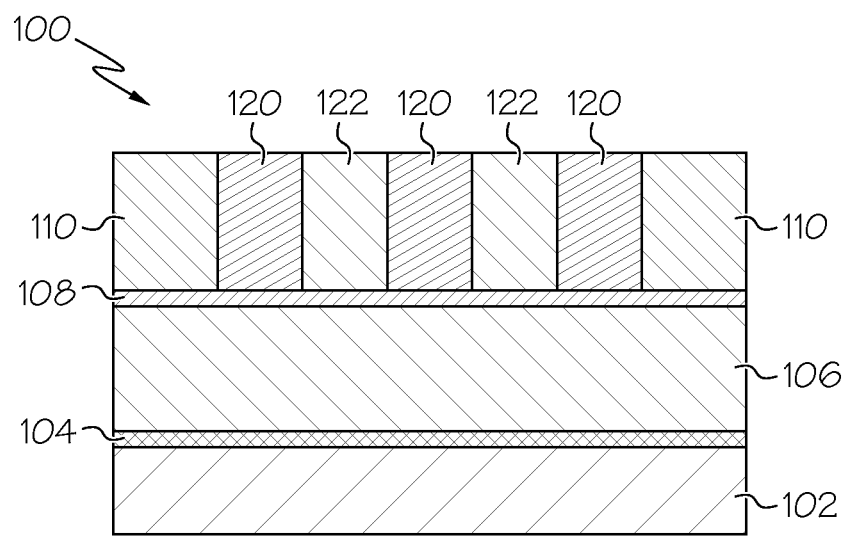

FIG. 1E is a semiconductor structure after a subsequent process step of phase separating the first DSA material layer in accordance with illustrative embodiments.

Figure 1F:
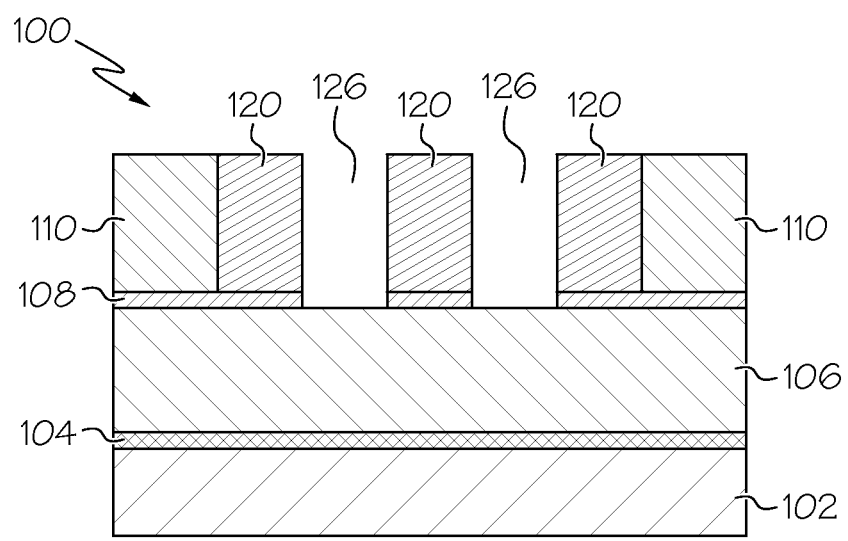

FIG. 1F is a semiconductor structure after a subsequent process step of removing one phase region of the first DSA material layer in accordance with illustrative embodiments.

Figure 1G:
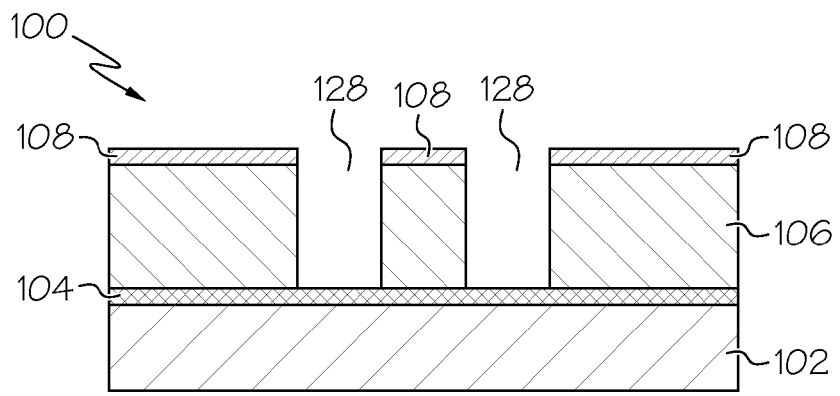

FIG. 1G is a semiconductor structure after a subsequent process step of etching the first dielectric region in accordance with illustrative embodiments.

Figure 1H:
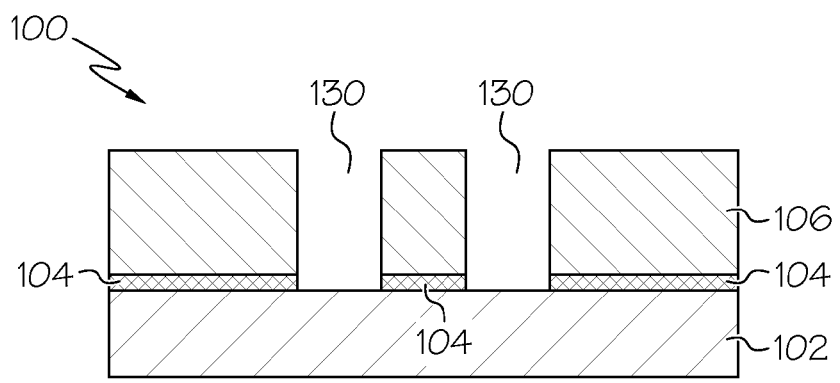

FIG. 1H is a semiconductor structure after a subsequent process step of opening the contact etch stop layer in accordance with illustrative embodiments.

Figure 1I:
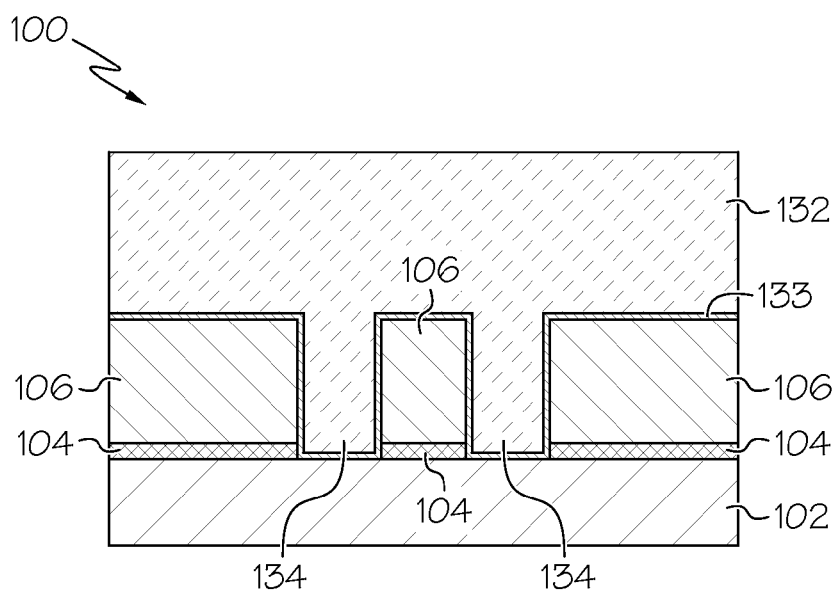

FIG. 1i is a semiconductor structure after subsequent process steps of depositing a barrier layer and a metal fill layer in accordance with illustrative embodiments.

Figure 1J:
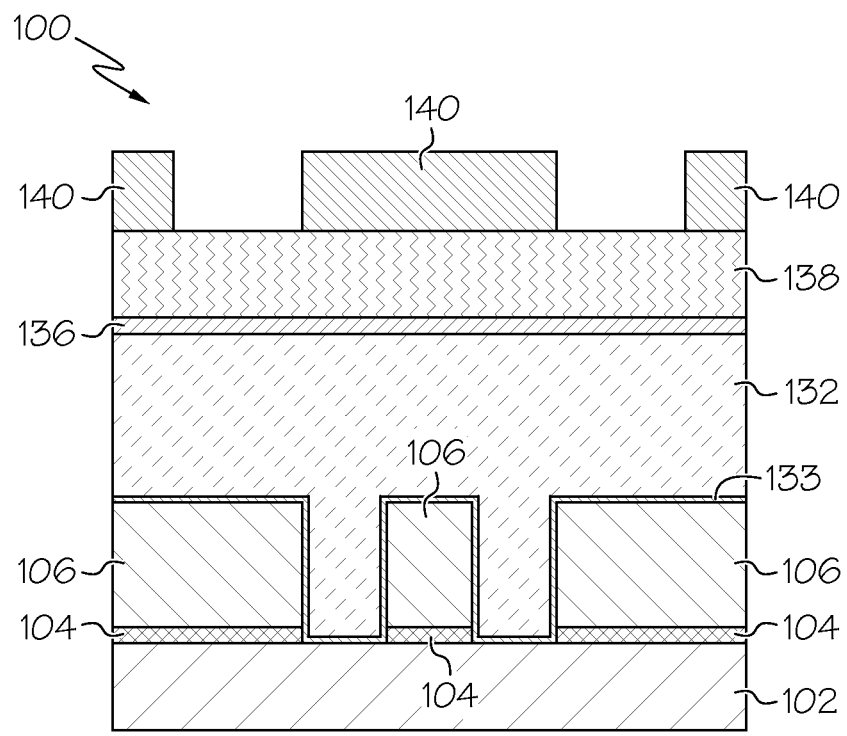

FIG. 1J is a semiconductor structure after a subsequent process step of depositing a second sacrificial layer in accordance with illustrative embodiments.

Figure 1K:
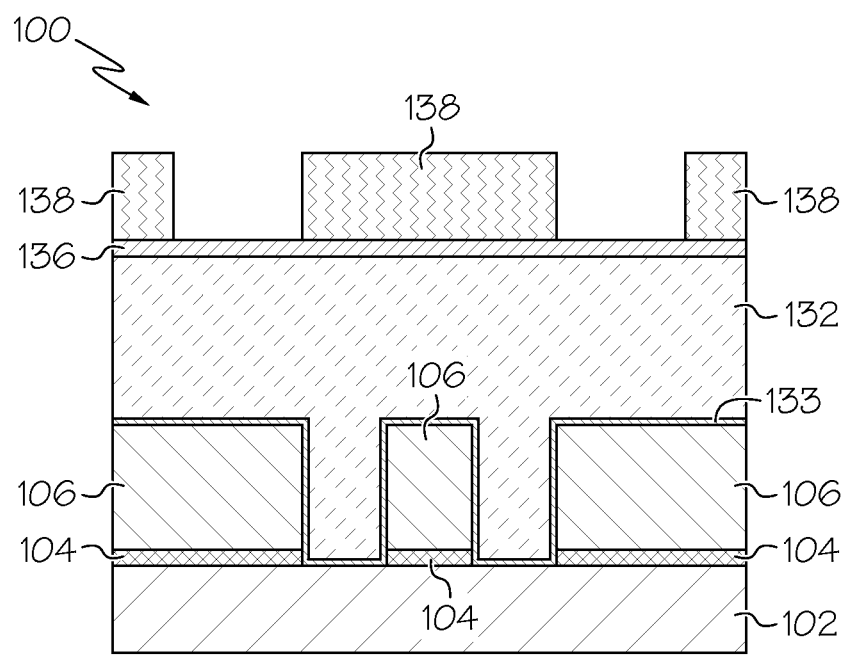

FIG. 1K is a semiconductor structure after a subsequent process step of patterning the second sacrificial layer in accordance with illustrative embodiments.

Figure 1L:
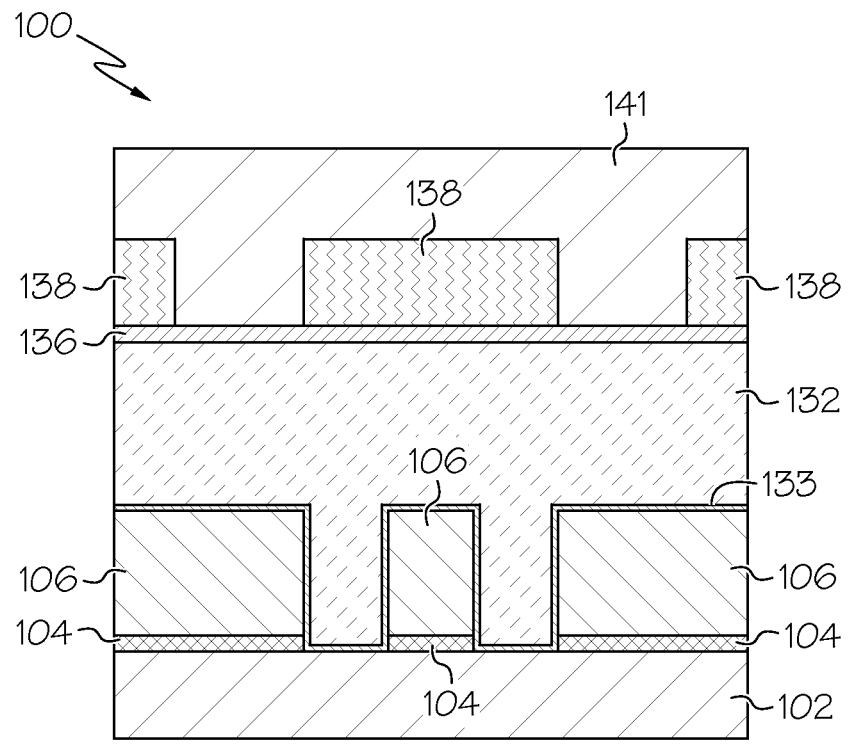

FIG. 1L is a semiconductor structure after a subsequent process step of depositing a second DSA material layer in accordance with illustrative embodiments.

Figure 1M:
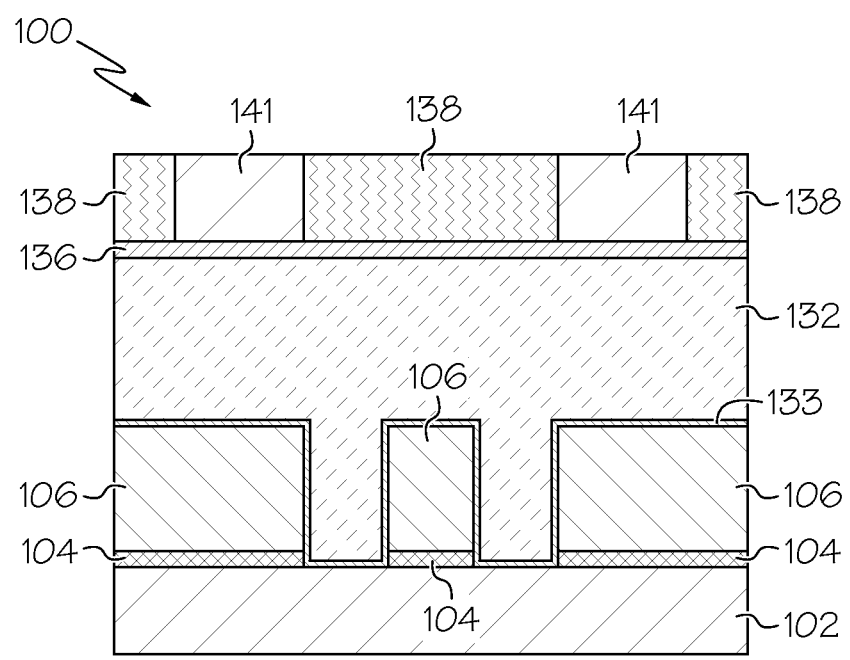

FIG. 1M is a semiconductor structure after a subsequent process step of recessing the second DSA material layer in accordance with illustrative embodiments.

Figure 1N:
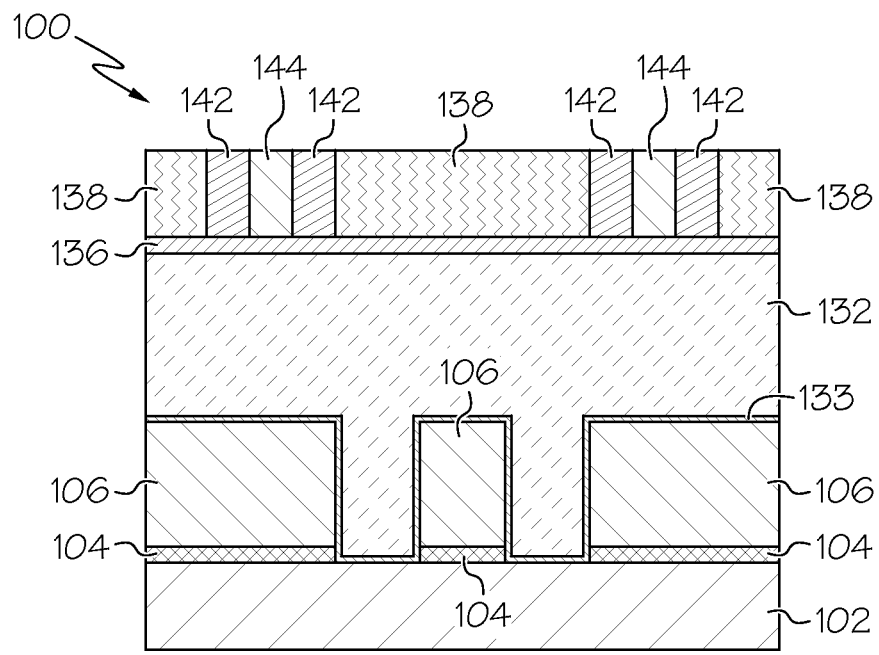

FIG. 1N is a semiconductor structure after a subsequent process step of phase separating the second DSA material layer in accordance with illustrative embodiments.

Figure 1O:
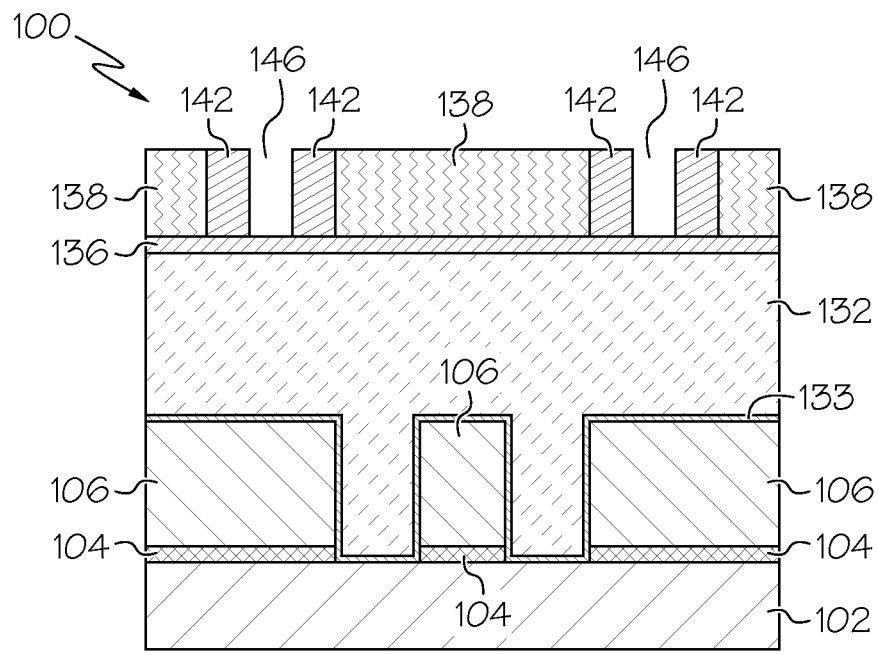

FIG. 1o is a semiconductor structure after a subsequent process step of removing one phase region of the second DSA material layer in accordance with illustrative embodiments.

Figure 1P:
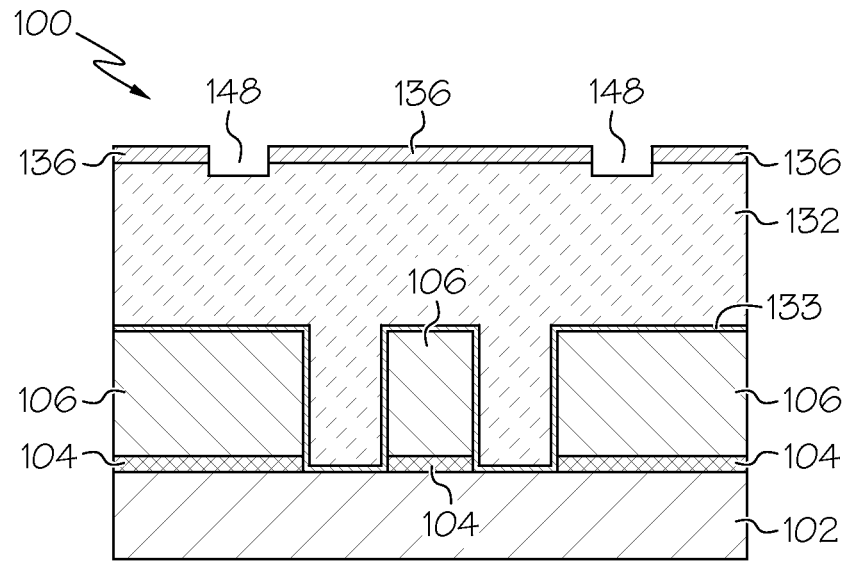

FIG. 1P is a semiconductor structure after a subsequent process step of exposing a portion of the metal layer in accordance with illustrative embodiments.

Figure 1Q:
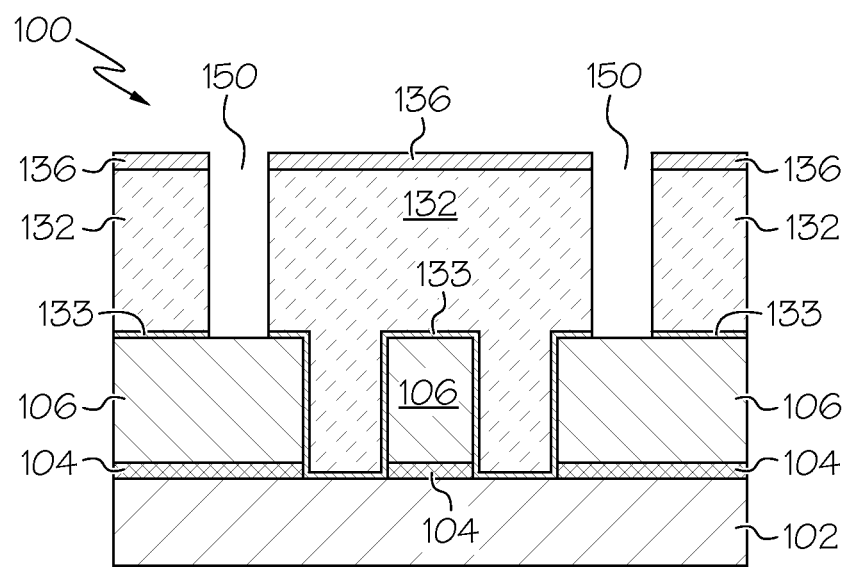

FIG. 1Q is a semiconductor structure after a subsequent process step of forming cavities in the metal layer in accordance with illustrative embodiments.

Figure 1R:
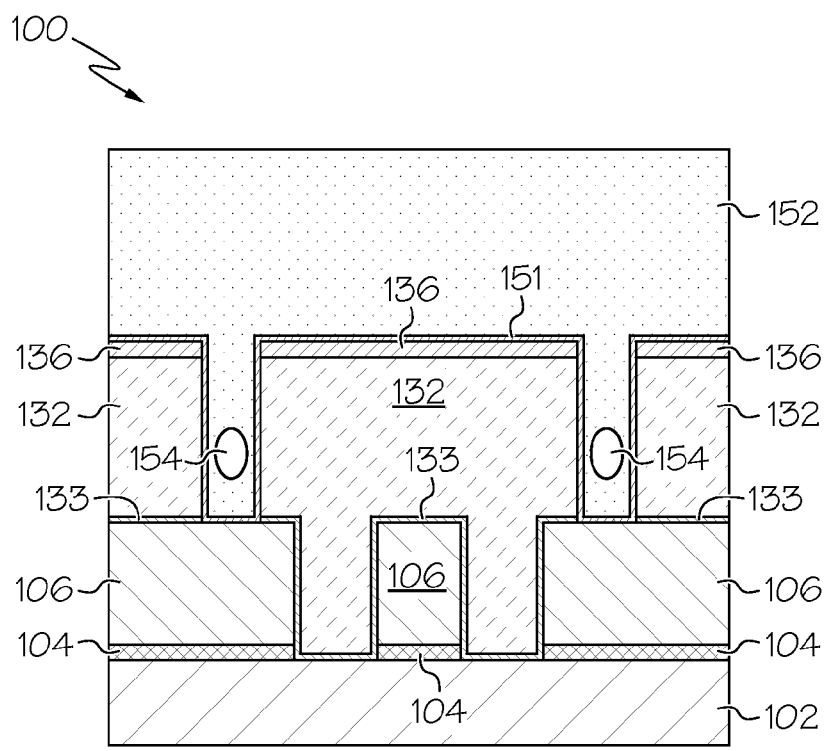

FIG. 1R is a semiconductor structure after a subsequent process step of depositing a second dielectric layer in accordance with illustrative embodiments.

Figure 1S:
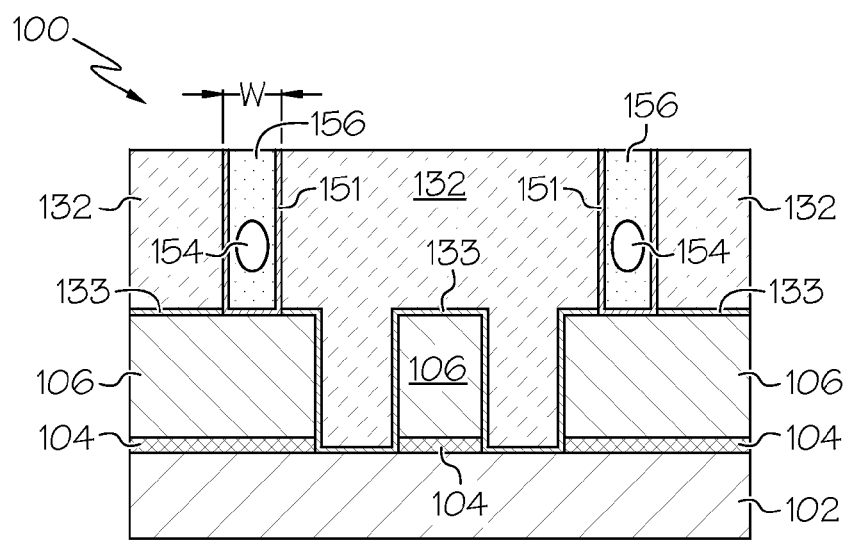

FIG. 1S is a semiconductor structure after a subsequent process step of planarizing the second dielectric layer.

Figure 2A:
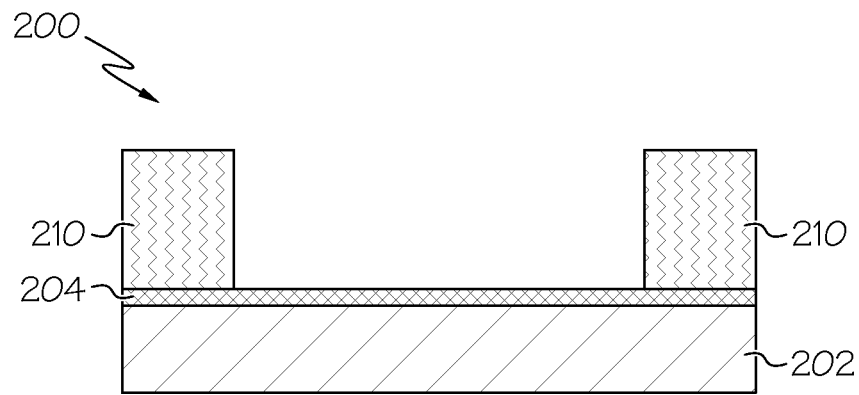

FIG. 2A is a semiconductor structure at a starting point for alternative illustrative embodiments.

Figure 2B:
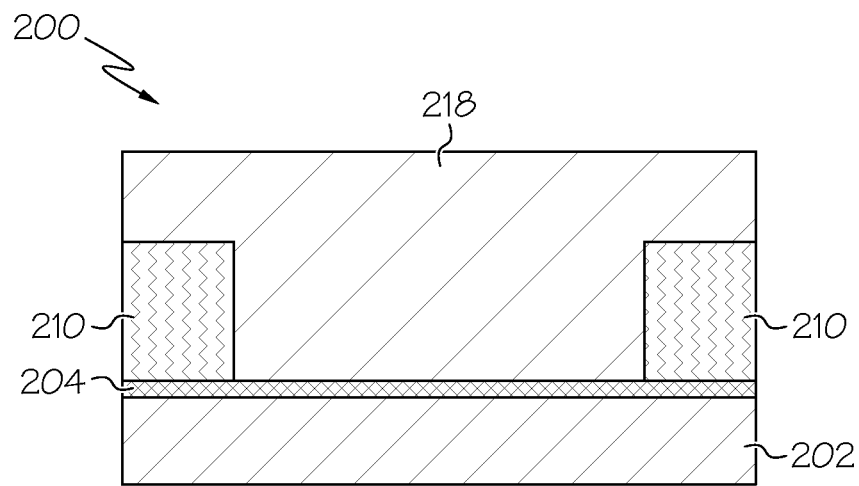

FIG. 2B is a semiconductor structure after a subsequent process step of depositing a first DSA material layer in accordance with alternative illustrative embodiments.

Figure 2C:
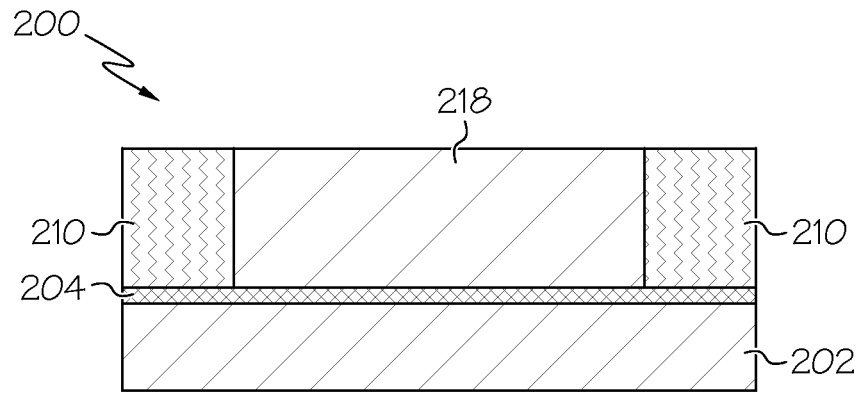

FIG. 2C is a semiconductor structure after a subsequent process step of recessing the first DSA material layer in accordance with alternative illustrative embodiments.

Figure 2D:
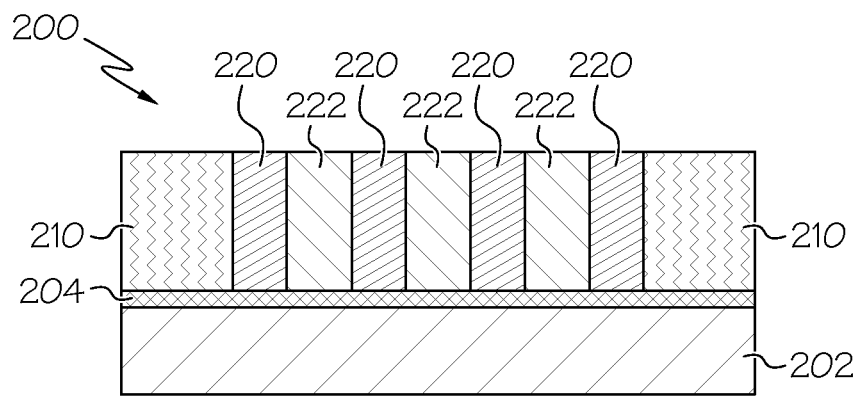

FIG. 2D is a semiconductor structure after a subsequent process step of phase separating the first DSA material layer in accordance with alternative illustrative embodiments.

Figure 2E:
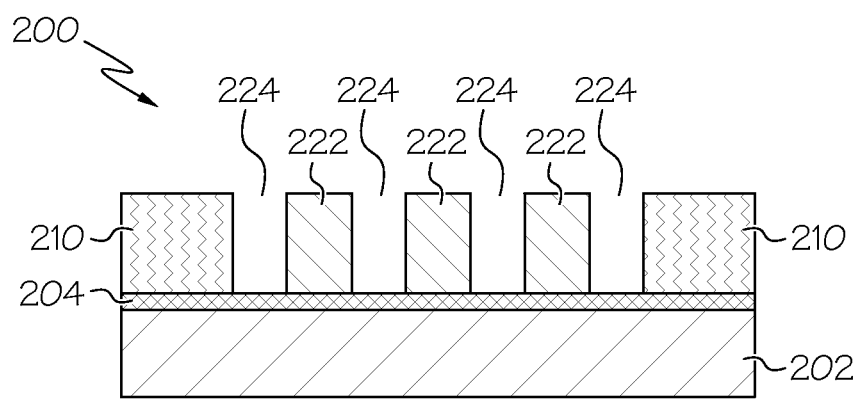

FIG. 2E is a semiconductor structure after a subsequent process step of removing one phase region of the first DSA material layer in accordance with alternative illustrative embodiments.

Figure 2F:
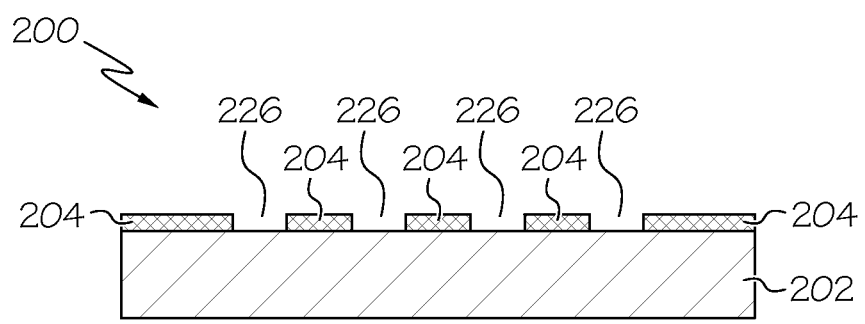

FIG. 2F is a semiconductor structure after a subsequent process step of exposing a portion of the semiconductor substrate in accordance with alternative illustrative embodiments.

Figure 2G:
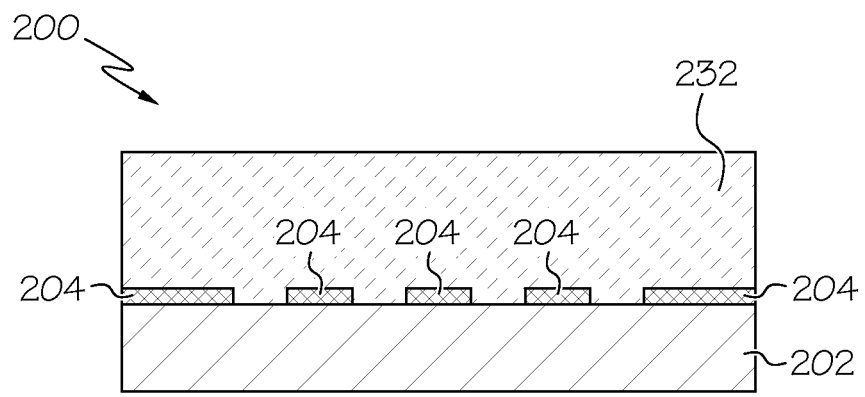

FIG. 2G is a semiconductor structure after a subsequent process step of depositing a first metal layer on the semiconductor substrate in accordance with alternative illustrative embodiments.

Figure 2H:
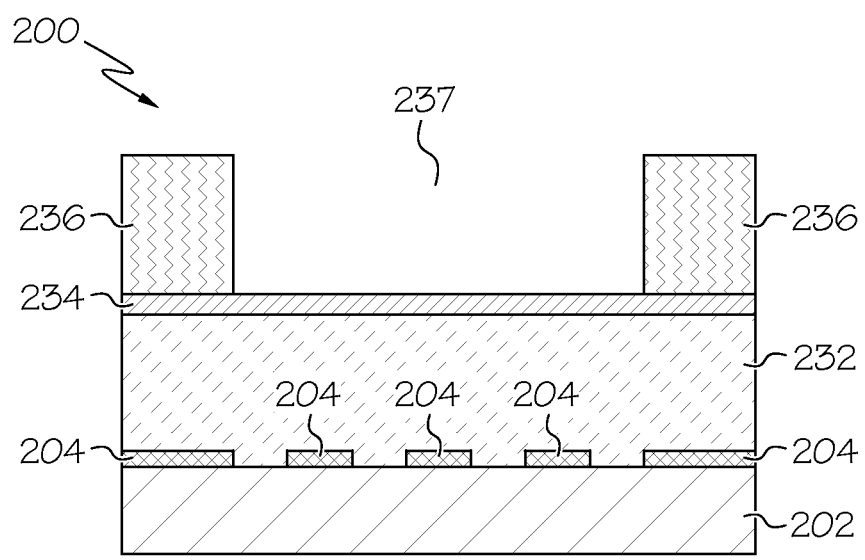

FIG. 2H is a semiconductor structure after subsequent process steps of depositing and patterning a sacrificial layer on the semiconductor substrate in accordance with alternative illustrative embodiments.

Figure 2I:
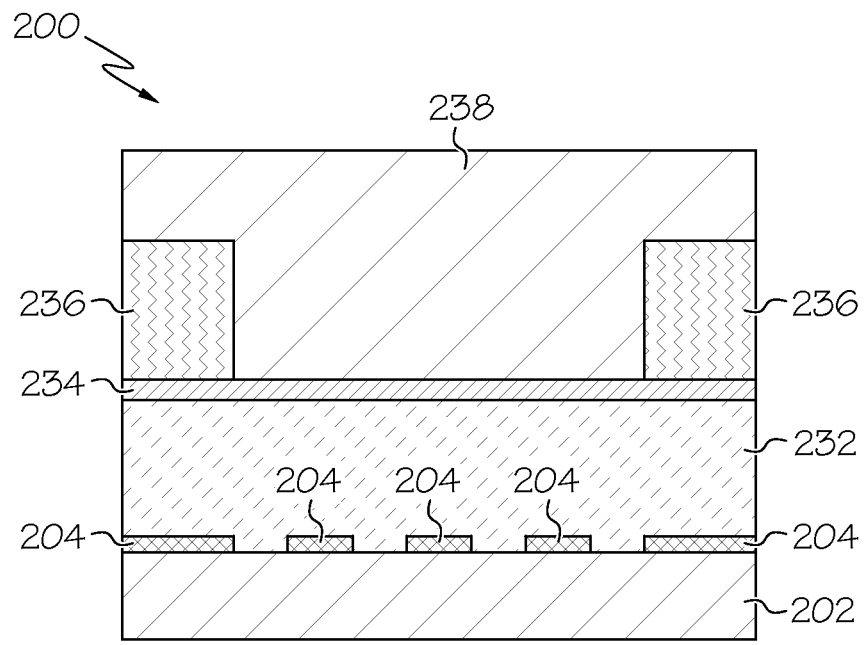

FIG. 2i is a semiconductor structure after a subsequent process step of depositing a second DSA material layer in accordance with alternative illustrative embodiments.

Figure 2J:
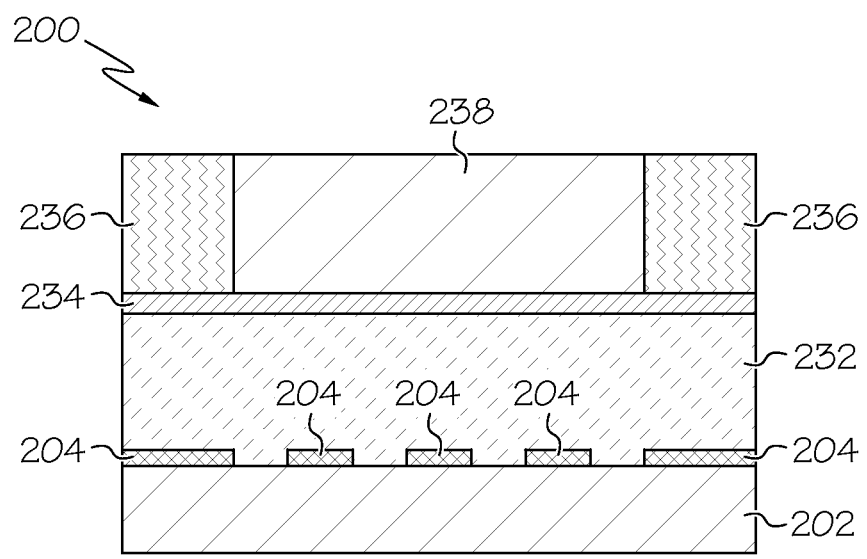

FIG. 2J is a semiconductor structure after a subsequent process step of recessing the second DSA material layer in accordance with alternative illustrative embodiments.

Figure 2K:
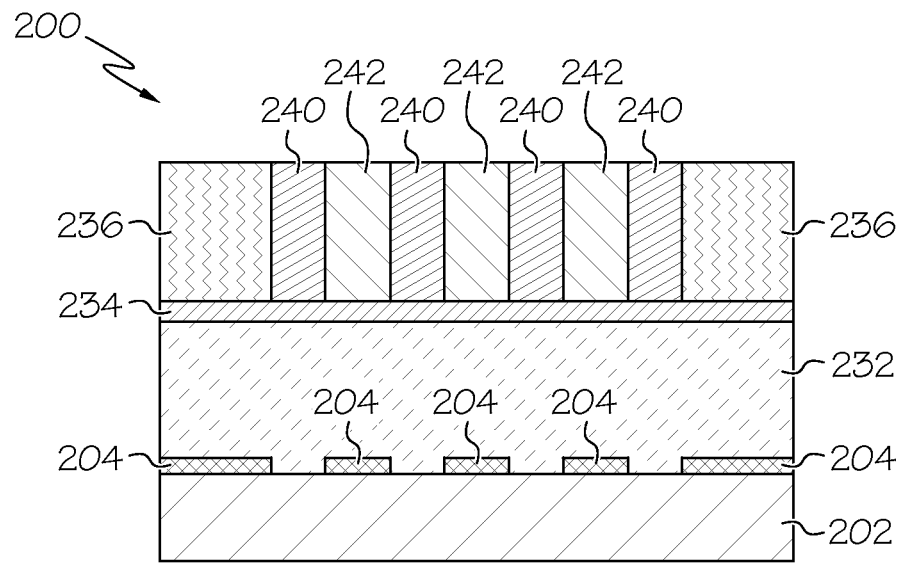

FIG. 2K is a semiconductor structure after a subsequent process step of phase separating the second DSA material layer in accordance with alternative illustrative embodiments.

Figure 2L:
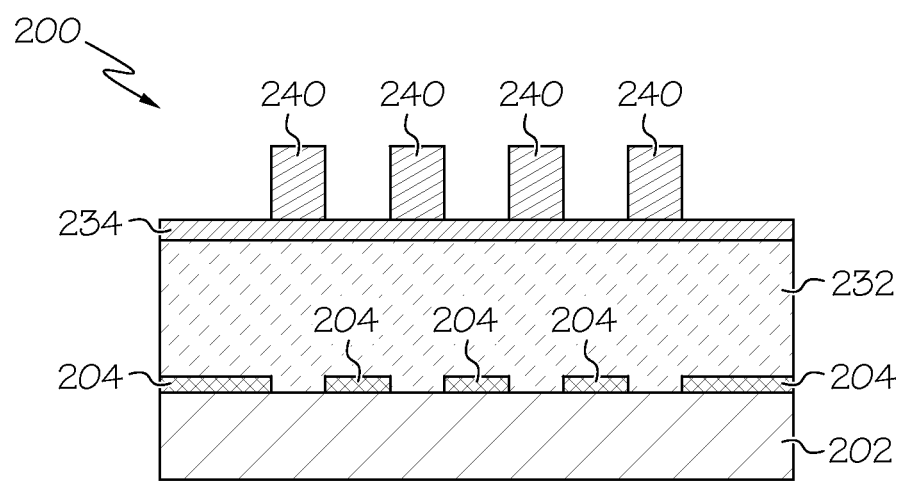

FIG. 2L is a semiconductor structure after a subsequent process step of removing one phase of the second DSA material layer in accordance with alternative illustrative embodiments.

Figure 2M:
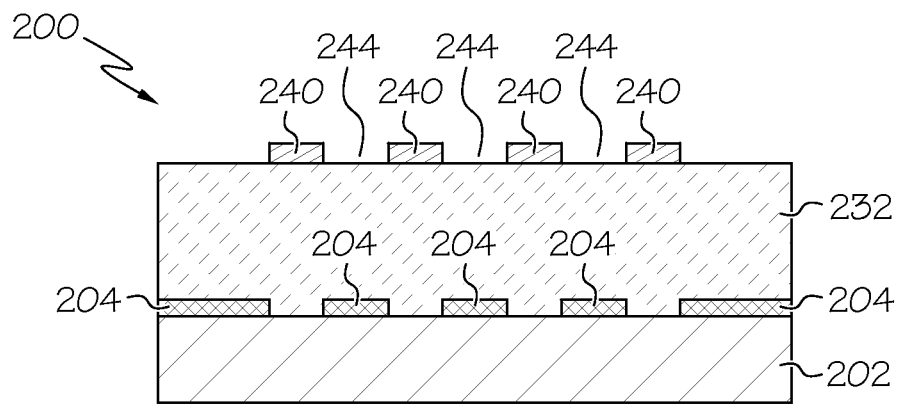

FIG. 2M is a semiconductor structure after a subsequent process step of exposing a portion of the first metal layer in accordance with alternative illustrative embodiments.

Figure 2N:
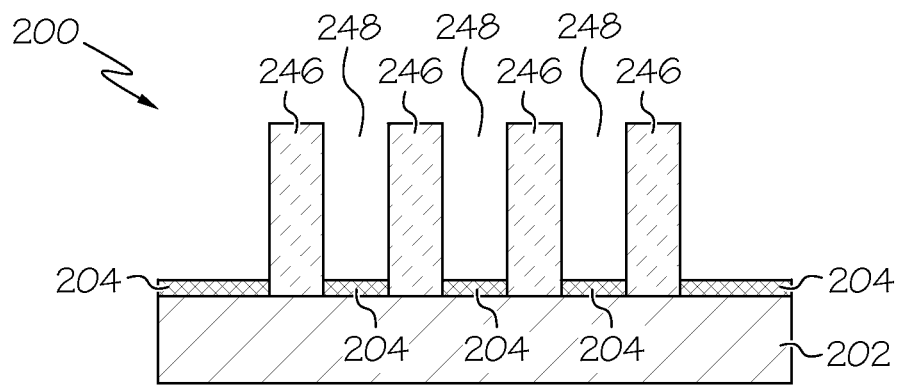

FIG. 2N is a semiconductor structure after a subsequent process step of etching a portion of the first metal layer in accordance with alternative illustrative embodiments.

Figure 2O:
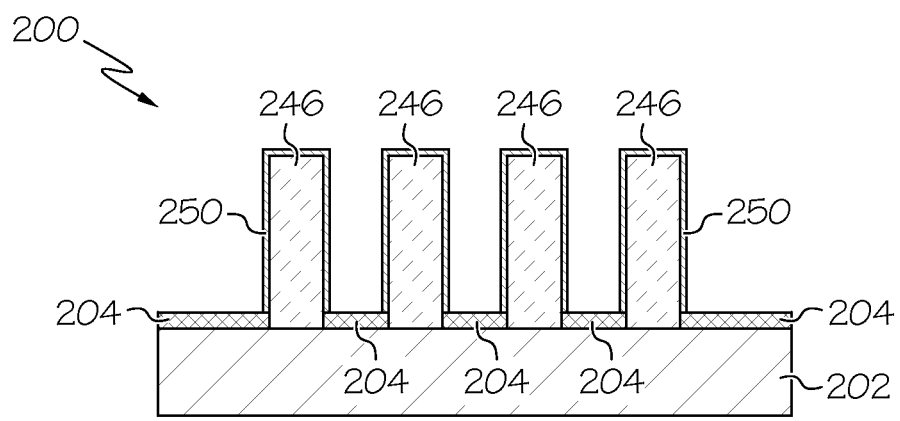

FIG. 2o is a semiconductor structure after a subsequent process step of depositing a barrier layer on the first metal layer in accordance with alternative illustrative embodiments.

Figure 2P:
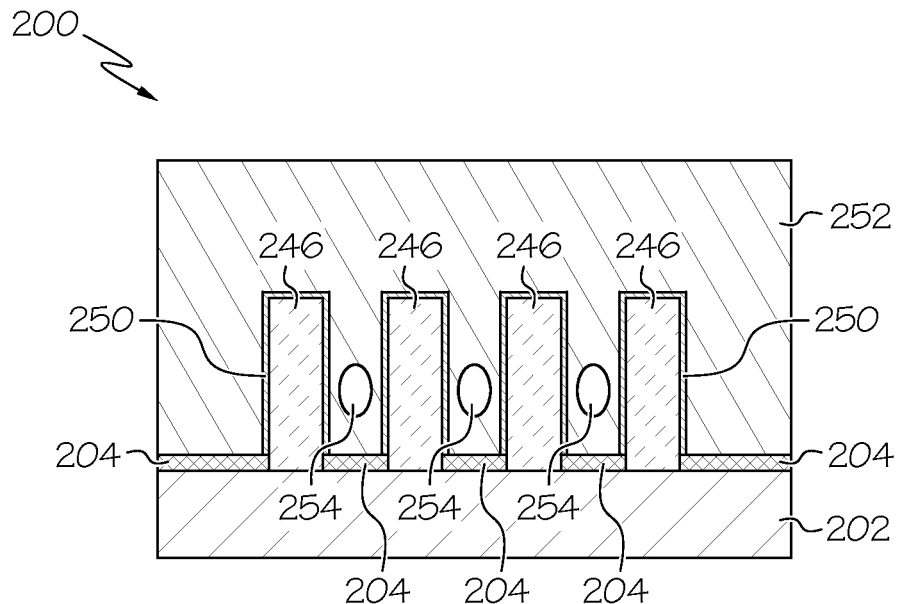

FIG. 2P is a semiconductor structure after a subsequent process step of depositing a dielectric layer in accordance with alternative illustrative embodiments.

Figure 2Q:
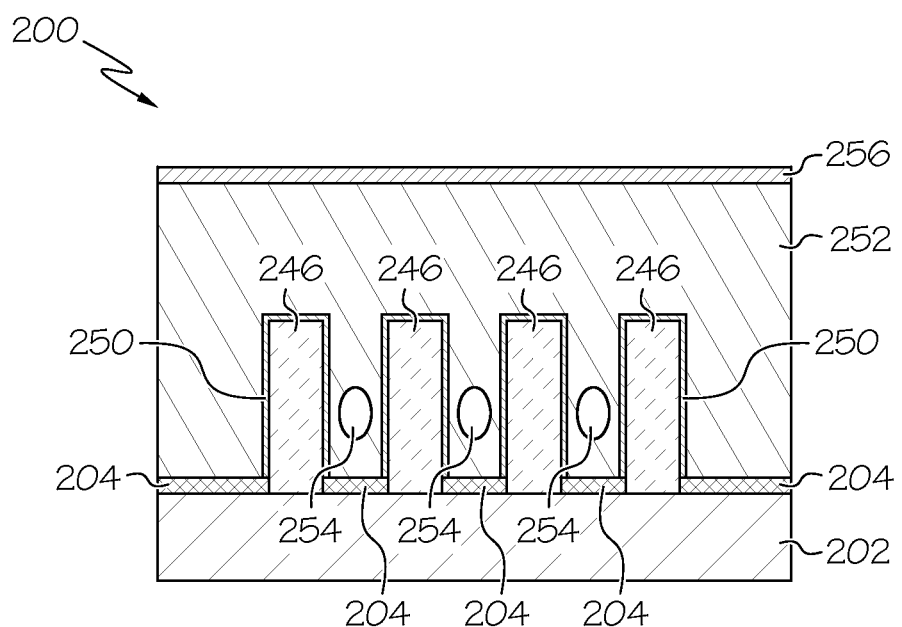

FIG. 2Q is a semiconductor structure after a subsequent process step of depositing a hard mask layer in accordance with alternative illustrative embodiments.

Figure 2R:
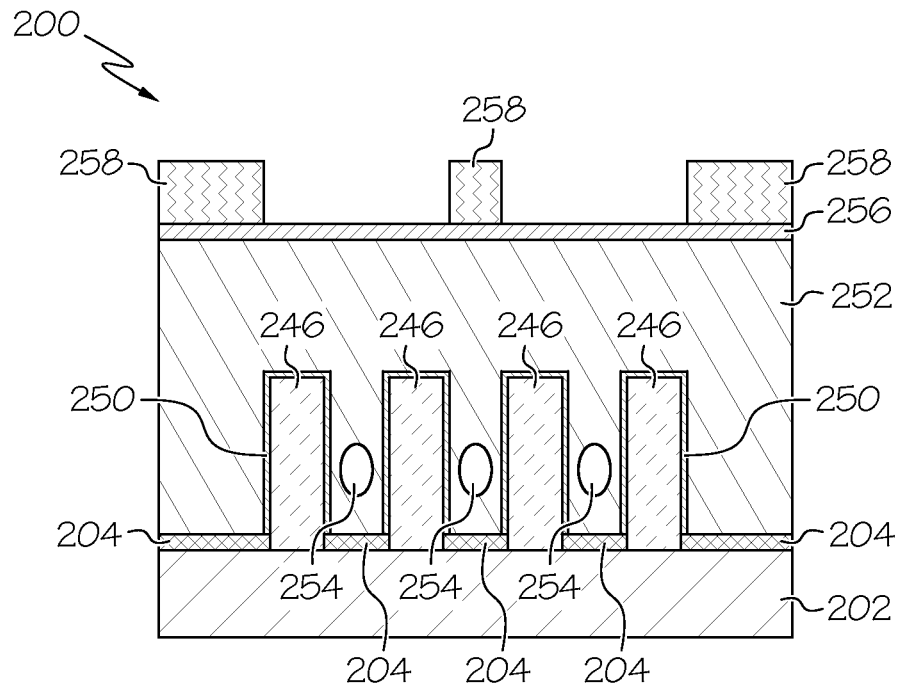

FIG. 2R is a semiconductor structure after subsequent process steps of depositing and patterning a sacrificial layer on the semiconductor substrate in accordance with alternative illustrative embodiments.

Figure 2S:
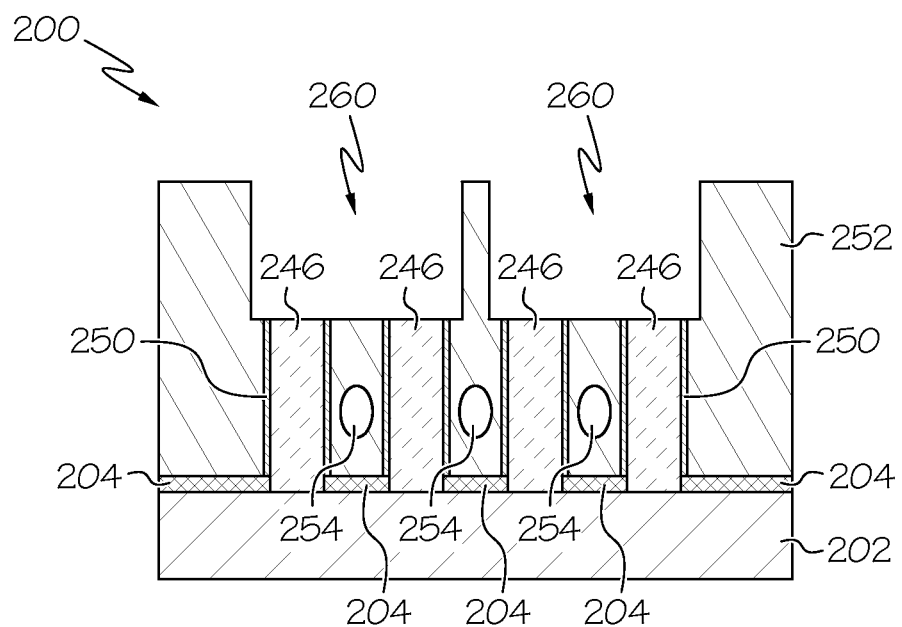

FIG. 2S is a semiconductor structure after a subsequent process step of forming cavities in the dielectric layer to expose the first metal layer in accordance with alternative illustrative embodiments.

Figure 2T:
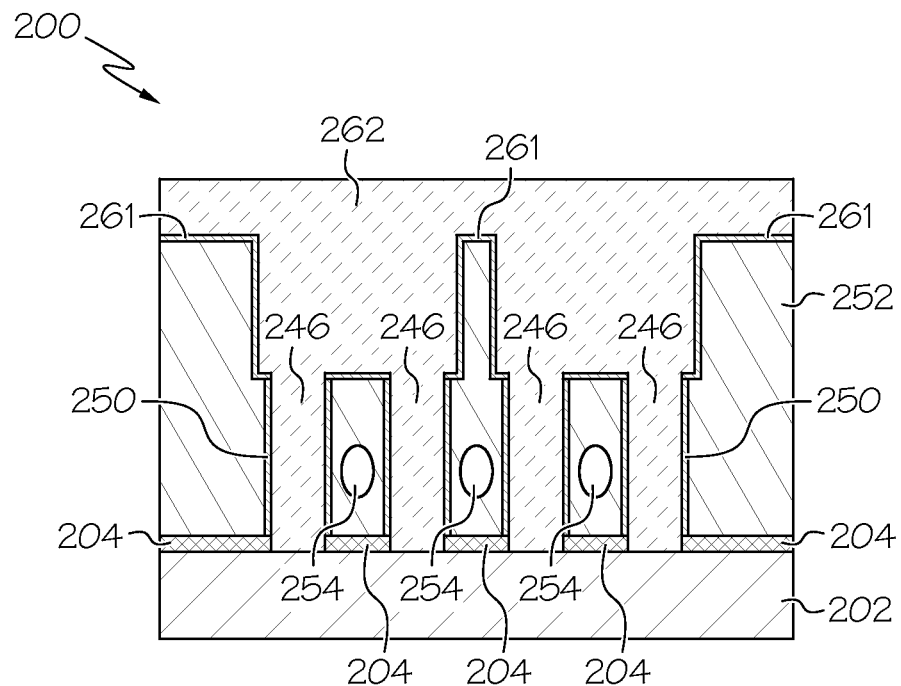

FIG. 2T is a semiconductor structure after a subsequent process step of depositing second metal layer in accordance with alternative illustrative embodiments.

Figure 2U:
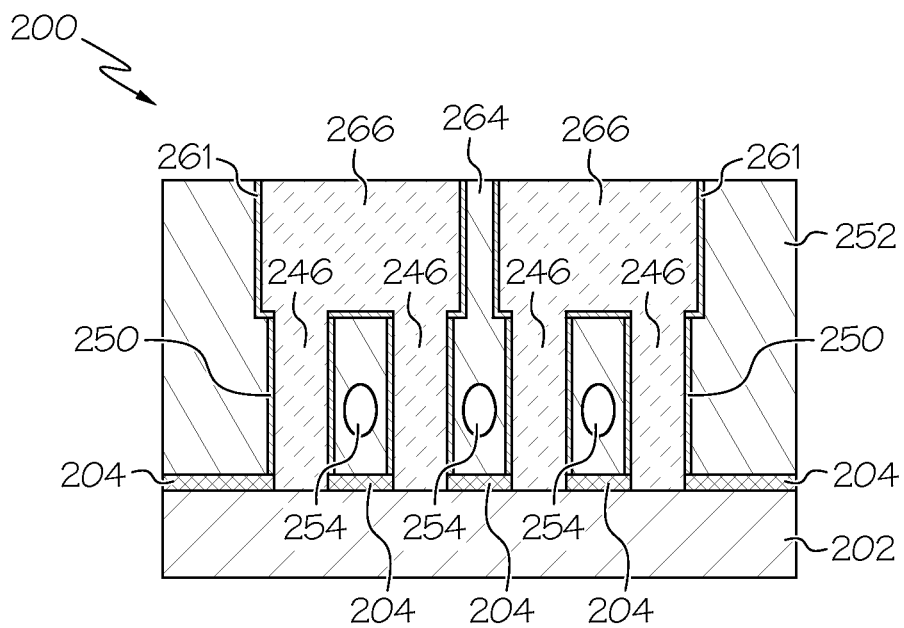

FIG. 2U is a semiconductor structure after a subsequent process step of planarizing the second metal layer in accordance with alternative illustrative embodiments.

Figure 3:
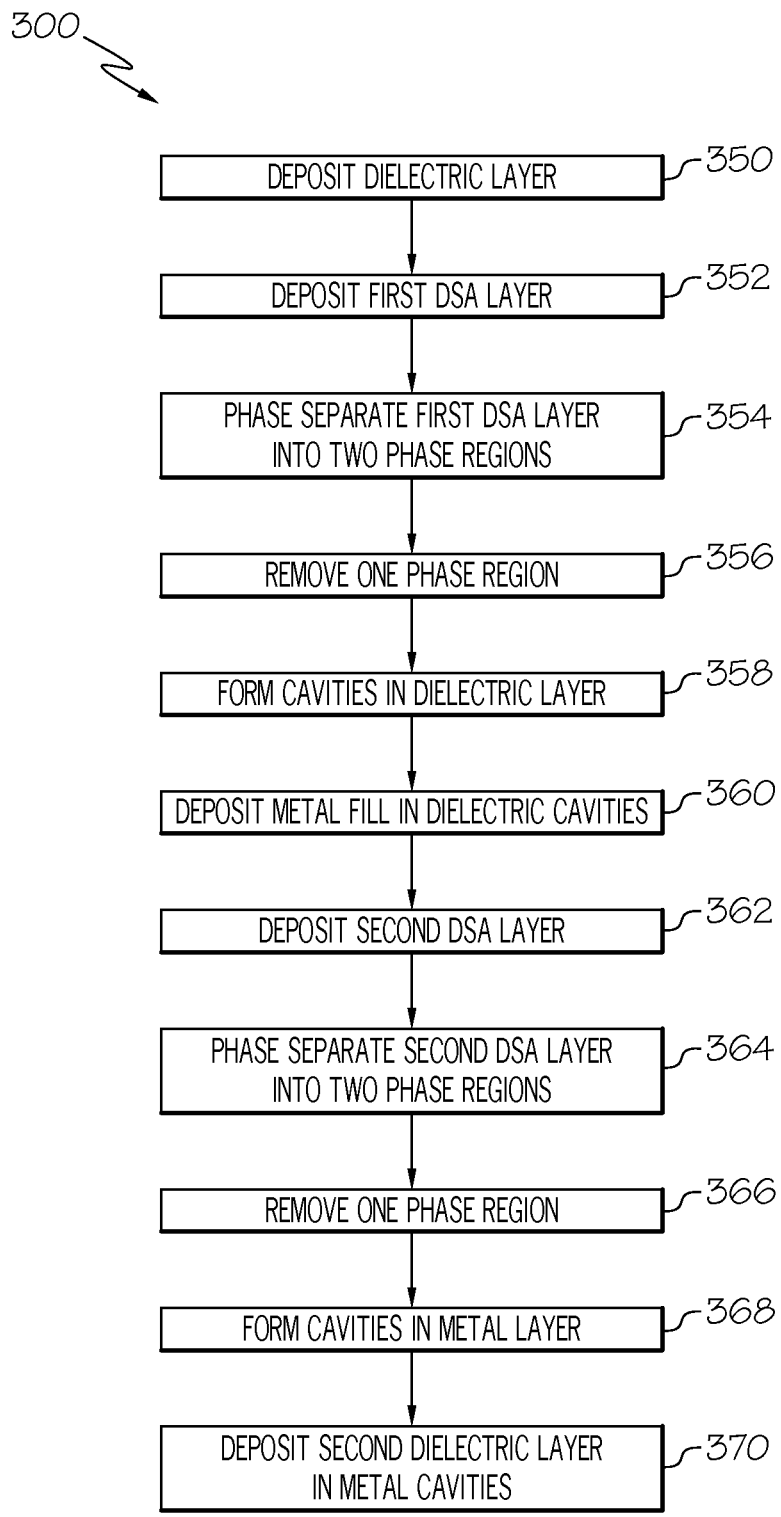

FIG. 3 is a flowchart showing process steps for embodiments of the present invention.

DETAILED DESCRIPTION

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer), is present on a second element, such as a second structure (e.g., a second layer), wherein intervening elements, such as an interface structure (e.g., interface layer), may be present between the first element and the second element.

FIG. 1A is a semiconductor structure 100 at a starting point for illustrative embodiments. Semiconductor structure 100 comprises a semiconductor substrate 102. In embodiments, substrate 102 may comprise a silicon substrate. An etch stop layer 104 is disposed on the substrate 102. In embodiments, the etch stop layer 104 is comprised of silicon nitride. A dielectric layer 106 is disposed on the etch stop layer 104. In embodiments, the dielectric layer 106 may be an ultra low K (ULK) dielectric layer (K<2.6), and may be comprised of SiCOH, methyl silsesquioxane (MSQ), or other suitable material. A hardmask layer 108 is disposed on the dielectric layer 106. In embodiments, the hardmask layer 108 may include, but is not limited to, SiN, SiON, SiC, SiC:B, TiN or other suitable material. A sacrificial layer 110 is disposed on hardmask layer 108. In embodiments, the sacrificial layer 110 is tetraethoxysilane (TEOS) oxide, and may be deposited by chemical vapor deposition (CVD). Resist regions 112 are formed on the sacrificial layer 110, having a gap 114 between them to expose a portion of sacrificial layer 110. Industry standard lithographic and patterning techniques may be used to form resist regions 112.

FIG. 1B is semiconductor structure 100 after a subsequent process step of etching a sacrificial layer in accordance with illustrative embodiments. In embodiments, the sacrificial layer is etched using an anisotropic etch process, such as a reactive ion etch (RIE) to form opening 116 which exposes a portion of hardmask layer 108. The resist regions 112 (FIG. 1A) are then removed.

FIG. 1C is semiconductor structure 100 after a subsequent process step of depositing a first directed self-assembly (DSA) material layer 118 in accordance with illustrative embodiments. In embodiments, DSA material layer 118 comprises a PS-b-PMMA block copolymer (polystyrene-b-polymethylmethacrylate BCP).

FIG. 1D is semiconductor structure 100 after a subsequent process step of recessing the first DSA material layer 118 in accordance with illustrative embodiments. In embodiments, DSA material layer 118 is recessed using an ashing process. In embodiments, the ashing process includes a plasma comprising O2 plasma, CO2 plasma, and/or N2/H2 plasma.

FIG. 1E is semiconductor structure 100 after a subsequent process step of phase separating the first DSA material layer in accordance with illustrative embodiments. As a result of the separation, a first phase region 120 and a second phase region 122 are formed. In embodiments, as a result of the phase separation process, the first phase region 120 is comprised of PMMA (polymethylmethacrylate) and the second phase region 122 is comprised of PS (polystyrene). In embodiments, the phase separation is achieved by performing an anneal at a process temperature ranging from about 200 degrees Celsius to about 350 degrees Celsius.

FIG. 1F is semiconductor structure 100 after a subsequent process step of removing one phase region of the first DSA material layer in accordance with illustrative embodiments. As the two phase regions are comprised of different materials, one of the phase regions may be selectively removed. In the example shown in FIG. 1F, the first phase region 120 is preserved, while the second phase region 122 (FIG. 1E) is removed. In embodiments, the second phase region 122 is removed using an oxygen strip process. As a result of the removal of the second phase region, cavities 126 are formed, which expose a portion of dielectric layer 106.

FIG. 1G is semiconductor structure 100 after a subsequent process step of etching the first dielectric region 106 in accordance with illustrative embodiments. As a result of the etch, cavities 128 are formed in the dielectric. In embodiments, the cavities are formed using a fluorocarbon (CxFy) dry etch, utilizing an etchant such as CF4, or a gas containing C4F6. The remaining sacrificial layer 110 and first phase region 120 are then removed.

FIG. 1H is semiconductor structure 100 after a subsequent process step of opening the contact etch stop layer 104 in accordance with illustrative embodiments. In embodiments, the etch stop layer 104 may be removed using a selective etch process that is selective to silicon nitride. As a result, cavities 130 are formed, which expose a portion of the substrate 102.

FIG. 1i is semiconductor structure 100 after subsequent process steps of depositing a barrier layer 133 and a metal fill layer 132 in accordance with illustrative embodiments. In embodiments, the barrier layer 133 may be comprised of tantalum nitride, and may be deposited via an atomic layer deposition (ALD) process. Next, the metal fill layer 132 is deposited. In embodiments, the metal fill layer 132 is comprised of copper. In other embodiments, the metal fill layer may include tungsten and/or aluminum. The metal fill layer 132 has portions 134 which fill cavities 130 (FIG. 1H) and make contact with the substrate 102.

FIG. 1J is semiconductor structure 100 after subsequent process steps of depositing a second hardmask layer 136, and a second sacrificial layer 138 in accordance with illustrative embodiments. The second hardmask layer 136 may be formed of materials similar to hardmask layer 108. The second sacrificial layer 138 may be formed of materials similar to sacrificial layer 110. Resist regions 140 are then formed and patterned on the second sacrificial layer 138.

FIG. 1K is semiconductor structure 100 after a subsequent process step of patterning the second sacrificial layer 138 in accordance with illustrative embodiments. In embodiments, the sacrificial layer 138 is etched using an anisotropic etch process, such as a reactive ion etch (RIE) to expose a portion of hardmask layer 136. The resist regions 140 (FIG. 1J) are then removed.

FIG. 1L is semiconductor structure 100 after a subsequent process step of depositing a second DSA material layer 141 in accordance with illustrative embodiments. In embodiments, DSA material layer 141 comprises a PS-b-PMMA block copolymer (polystyrene-b-polymethylmethacrylate BCP).

FIG. 1M is semiconductor structure 100 after a subsequent process step of recessing the second DSA material layer 141 in accordance with illustrative embodiments. In embodiments, DSA material layer 141 is recessed using an ashing process. In embodiments, the ashing process includes a plasma comprising O2 plasma, CO2 plasma, and/or N2/H2 plasma.

FIG. 1N is a semiconductor structure after a subsequent process step of phase separating the second DSA material layer in accordance with illustrative embodiments. As a result of the separation, a first phase region 142 and a second phase region 144 are formed. In embodiments, as a result of the phase separation process, the first phase region 142 is comprised of PMMA (polymethylmethacrylate) and the second phase region 144 is comprised of PS (polystyrene). In embodiments, the phase separation is achieved by performing an anneal at a process temperature ranging from about 200 degrees Celsius to about 350 degrees Celsius.

FIG. 1o is semiconductor structure 100 after a subsequent process step of removing one phase region of the second DSA material layer in accordance with illustrative embodiments. As the two phase regions are comprised of different materials, one of the phase regions may be selectively removed. In the example shown in FIG. 1o, the first phase region 142 is preserved, while the second phase region 144 (FIG. 1E) is removed. In embodiments, the second phase region 144 is removed using an oxygen strip process. As a result of the removal of the second phase region, cavities 146 are formed, which expose a portion of hardmask 136.

FIG. 1P is semiconductor structure 100 after a subsequent process step of exposing a portion of the metal layer in accordance with illustrative embodiments. In embodiments, a portion of hardmask 136 may be removed using a selective etch process that is selective to that material (e.g., silicon nitride). As a result, cavities 148 are formed, which expose a portion of the metal fill layer 132.

FIG. 1Q is semiconductor structure 100 after a subsequent process step of forming cavities 150 in the metal layer 132 in accordance with illustrative embodiments. In embodiments, the process of forming cavities 150 may include, but is not limited to, CH4 plasma, H2 plasma, Cl2 plasma, and/or oxidation/wet etch. As a result of the etch, the cavities 150 extend into first dielectric region 106.

FIG. 1R is semiconductor structure 100 after a subsequent process step of depositing a barrier layer 151, followed by a second dielectric layer 152 in accordance with illustrative embodiments. In embodiments, the barrier layer 151 may include tantalum nitride. The barrier layer 151 serves to prevent diffusion of metal fill layer 132. The second dielectric layer 152 may have a dielectric constant value ranging from about 2.0 to about 2.55. In embodiments, the second dielectric layer may be deposited by chemical vapor deposition (CVD). In embodiments, the second dielectric layer 152 may be comprised of SiCOH, methyl silsesquioxane (MSQ), or other suitable material. The second dielectric layer 152 preferably has a property of forming a void 154 in narrow regions when deposited. That is, it is a non-conformal film in that it forms a void 154 in the narrow spaces of cavities 150.

FIG. 1S is semiconductor structure 100 after a subsequent process step of planarizing the second dielectric layer such that only dielectric (insulator) regions 156 remain. In embodiments, the planarization may be performed using a chemical mechanical polish (CMP) process. The dielectric portions 156 contain a void 154, having a width W. In embodiments, the width W ranges from about 5 nanometers to about 20 nanometers. In embodiments, the dielectric is a low-K dielectric, having a dielectric constant value ranging from about 2.0 to about 2.55.

As a result of the aforementioned process steps, the dielectric regions 156 serve to isolate various portions of metal fill layer 132 to facilitate implementation of functional integrated circuits (ICs).

FIG. 2A is a semiconductor structure 200 at a starting point for alternative illustrative embodiments. Semiconductor structure 200 comprises a semiconductor substrate 202. In embodiments, substrate 202 may comprise a silicon substrate. An etch stop layer 204 is disposed on the substrate 202. In embodiments, the etch stop layer 204 is comprised of silicon nitride. A patterned sacrificial layer 210 is disposed on etch stop layer 104. In embodiments, the sacrificial layer 210 is tetraethoxysilane (TEOS) oxide, and may be deposited by chemical vapor deposition (CVD) and then patterned similar to as described for FIGS. 1A and 1B, to expose a portion of the etch stop layer 204.

FIG. 2B is semiconductor structure 200 after a subsequent process step of depositing a first DSA material layer 218 in accordance with alternative illustrative embodiments. In embodiments, DSA material layer 218 comprises a PS-b-PMMA block copolymer (polystyrene-b-polymethylmethacrylate BCP).

FIG. 2C is semiconductor structure 200 after a subsequent process step of recessing the first DSA material layer 218 in accordance with alternative illustrative embodiments. In embodiments, DSA material layer 218 is recessed using an ashing process. In embodiments, the ashing process includes a plasma comprising O2 plasma, CO2 plasma, and/or N2/H2 plasma.

FIG. 2D is semiconductor structure 200 after a subsequent process step of phase separating the first DSA material layer 218 in accordance with alternative illustrative embodiments. As a result of the separation, a first phase region 220 and a second phase region 222 are formed. In embodiments, as a result of the phase separation process, the first phase region 220 is comprised of PMMA (polymethylmethacrylate) and the second phase region 222 is comprised of PS (polystyrene). In embodiments, the phase separation is achieved by performing an anneal at a process temperature ranging from about 200 degrees Celsius to about 350 degrees Celsius.

FIG. 2E is a semiconductor structure after a subsequent process step of removing one phase region of the first DSA material layer in accordance with alternative illustrative embodiments. As the two phase regions are comprised of different materials, one of the phase regions may be selectively removed. In the example shown in FIG. 2E, the first phase region 220 is removed, while the second phase region 222 (FIG. 2D) is preserved. In embodiments, the first phase region 220 is removed using an oxygen strip process. As a result of the removal of the first phase region, cavities 224 are formed, which expose a portion of the etch stop layer 204.

FIG. 2F is semiconductor structure 200 after a subsequent process step of exposing a portion of the semiconductor substrate in accordance with alternative illustrative embodiments. A portion of the etch stop layer 204 is removed, resulting in exposed areas 226 of substrate 202. Then, the remainder of the sacrificial layer 210 and the second phase region 222 is selectively removed.

FIG. 2G is semiconductor structure 200 after a subsequent process step of depositing a first metal layer 232 on the semiconductor structure in accordance with alternative illustrative embodiments. In embodiments, the metal fill layer 232 is comprised of copper. In other embodiments, the metal fill layer may include tungsten and/or aluminum.

FIG. 2H is semiconductor structure 200 after subsequent process steps of depositing and patterning a sacrificial layer on the semiconductor substrate in accordance with alternative illustrative embodiments. First, a hardmask layer 234, such as silicon nitride, is deposited on metal fill layer 232. Then, a sacrificial layer 236 is deposited on hardmask layer 234 and patterned, similar to as described for FIG. 1A and FIG, forming an opening 237 which exposes a portion of the hardmask layer 234. In embodiments, the sacrificial layer 236 is tetraethoxysilane (TEOS) oxide, and may be deposited by chemical vapor deposition (CVD).

FIG. 2i is semiconductor structure 200 after a subsequent process step of depositing a second DSA material layer 238 in accordance with alternative illustrative embodiments. In embodiments, DSA material layer 238 comprises a PS-b-PMMA block copolymer (polystyrene-b-polymethylmethacrylate BCP).

FIG. 2J is a semiconductor structure after a subsequent process step of recessing the second DSA material layer 238 in accordance with alternative illustrative embodiments. In embodiments, DSA material layer 238 is recessed using an ashing process. In embodiments, the ashing process includes a plasma comprising O2 plasma, CO2 plasma, and/or N2/H2 plasma.

FIG. 2K is semiconductor structure 200 after a subsequent process step of phase separating the second DSA material layer 238 in accordance with alternative illustrative embodiments. As a result of the separation, a first phase region 240 and a second phase region 242 are formed. In embodiments, as a result of the phase separation process, the first phase region 240 is comprised of PMMA (polymethylmethacrylate) and the second phase region 242 is comprised of PS (polystyrene). In embodiments, the phase separation is achieved by performing an anneal at a process temperature ranging from about 200 degrees Celsius to about 350 degrees Celsius.

FIG. 2L is semiconductor structure 200 after a subsequent process step of removing one phase of the second DSA material layer in accordance with alternative illustrative embodiments. As the two phase regions are comprised of different materials, one of the phase regions may be selectively removed. In the example shown in FIG. 2L, the first phase region 240 is preserved, while the second phase region 242 (FIG. 2K) is removed. In embodiments, the second phase region 244 is removed using an oxygen strip process. The remaining sacrificial region 236 (FIG. 2K) is also removed.

FIG. 2M is semiconductor structure 200 after a subsequent process step of exposing a portion of the first metal layer in accordance with alternative illustrative embodiments. First, a portion of hardmask layer 234 is removed, resulting in areas of exposed metal layer 232, shown generally as 244. Then, the first phase region 240 is selectively removed.

FIG. 2N is semiconductor structure 200 after a subsequent process step of etching a portion of the first metal layer in accordance with alternative illustrative embodiments. As a result of the etch, the areas not covered by regions of hardmask are removed, forming cavities 248 which expose the etch stop layer 204, while metal regions 246 remain. After the metal etch, the remaining hardmask layer 234 is removed.

FIG. 2o is semiconductor structure 200 after a subsequent process step of depositing a barrier layer 250 on metal regions 246 in accordance with alternative illustrative embodiments. In embodiments, the barrier layer 250 may be comprised of tantalum nitride, and may be deposited via an atomic layer deposition (ALD) process.

FIG. 2P is semiconductor structure 200 after a subsequent process step of depositing a dielectric layer 252 in accordance with alternative illustrative embodiments. In embodiments, the dielectric layer 252 may be an ultra low K (ULK) dielectric layer (K<2.6), and may be comprised of SiCOH, methyl silsesquioxane (MSQ), or other suitable material. Voids 254 form in between the metal regions 246. The voids may serve to reduce parasitic capacitances.

FIG. 2Q is semiconductor structure 200 after a subsequent process step of depositing a hardmask layer 256 in accordance with alternative illustrative embodiments. In embodiments, the hardmask layer 256 may be comprised of silicon nitride.

FIG. 2R is semiconductor structure 200 after subsequent process steps of depositing and patterning a sacrificial layer 258 on the semiconductor substrate in accordance with alternative illustrative embodiments. In embodiments, the sacrificial layer 258 is tetraethoxysilane (TEOS) oxide, and may be deposited by chemical vapor deposition (CVD) and then patterned similar to as described for FIGS. 1A and 1B, to expose a portion of the hardmask layer 256.

FIG. 2S is semiconductor structure 200 after a subsequent process step of forming cavities in the dielectric layer 258 to form cavities 260 which expose the regions 246 of the first metal layer in accordance with alternative illustrative embodiments.

FIG. 2T is semiconductor structure 200 after a subsequent process step of depositing second metal layer 262 in accordance with alternative illustrative embodiments. Prior to depositing metal layer 262, a barrier layer 261 may be deposited on the dielectric layer 252.

FIG. 2U is semiconductor structure 200 after a subsequent process step of planarizing the second metal layer in accordance with alternative illustrative embodiments. In embodiments, the planarizing is performed with a chemical mechanical polish (CMP) process. After the planarization, semiconductor structure 200 now comprises a semiconductor substrate 202, with a layer of dielectric 252 disposed on the semiconductor substrate. As a result of the planarization, multiple metal regions 266 are formed on the layer of dielectric 252, and a portion 246 of the metal region traverses the layer of dielectric 252 and is in contact with the semiconductor substrate 202. Insulator region 264 is disposed between the metal regions 266. In embodiments, the insulator region 264 is comprised of a low-K dielectric (a dielectric constant value ranging from about 2.0 to about 2.55). The void 254 that forms in high aspect ratio regions during the deposition of dielectric 252 may serve to reduce parasitic capacitance, and hence improve integrated circuit performance.

FIG. 3 is a flowchart 300 showing process steps for embodiments of the present invention. In process step 350, a dielectric layer is deposited. In process step 352, a first DSA layer is deposited. In process step 354, the first DSA layer is separated into two phase regions. This may be done with an anneal. In process step 356, one of the phase regions is selectively removed. In process step 358, cavities are formed in the underlying dielectric layer, below the removed phase region. In process step 360, metal is deposited in the cavities. This process is then repeated with steps 362-368. In process step 362, a second DSA layer is deposited. In process step 364, the second DSA layer is separated into two phase regions. In process step 366, one of the phase regions is removed. In process step 368, cavities are formed in the metal layer. In process step 370, dielectric is deposited into the cavities, to isolate different regions of the metal layer, which enables the forming of integrated circuits.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method of forming a semiconductor structure, comprising:
   depositing a first dielectric layer on a semiconductor substrate;
   depositing a first layer of DSA material on the first dielectric layer;
   performing a phase separation of the first layer of DSA material into a first phase region and a second phase region;

selectively etching one phase region of the first phase region and second phase region of the first layer of DSA material;

forming cavities in the first dielectric layer;

depositing a metal fill layer in the cavities of the first dielectric layer;

depositing a second layer of DSA material over the metal fill layer;

performing a phase separation of the second layer of DSA material into a first phase region and a second phase region;

selectively etching one phase region of the first phase region and second phase region of the second layer of DSA material;

forming cavities in the metal fill layer; and depositing a second dielectric layer over the metal fill layer and in the metal layer cavities.

2. The method of claim 1, wherein depositing a first layer of DSA material comprises depositing PS-b-PMMA block copolymer.

3. The method of claim 2, wherein performing a phase separation of the first layer of DSA material into a first phase region and a second phase region comprises performing an anneal at a process temperature ranging from about 200 degrees Celsius to about 350 degrees Celsius.

4. The method of claim 2, further comprising recessing the first layer of DSA material using an ashing process.

5. The method of claim 4, wherein the ashing process includes a plasma selected from the group consisting of O2 plasma, CO2 plasma, and N2/H2 plasma.

6. The method of claim 1, wherein forming cavities in the first dielectric layer is performed with a fluorocarbon dry etch.

7. The method of claim 1, wherein depositing a first dielectric layer on a semiconductor substrate comprises depositing SiCOH.

8. The method of claim 1, wherein depositing a first dielectric layer on a semiconductor substrate comprises depositing methyl silsesquioxane.

9. The method of claim 1, wherein depositing a metal fill layer in the cavities of the first dielectric layer comprises depositing copper.

10. The method of claim 1, further comprising planarizing the second dielectric layer.

\* \* \* \* \*